(12) United States Patent
Nam et al.

(10) Patent No.: US 7,599,234 B2
(45) Date of Patent: Oct. 6, 2009

(54) SEMICONDUCTOR MEMORY DEVICES HAVING SIGNAL DELAY CONTROLLER AND METHODS PERFORMED THEREIN

(75) Inventors: Jeong-Sik Nam, Seoul (KR); Ho-Sung Song, Seoul (KR)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 263 days.

(21) Appl. No.: 11/349,995

(22) Filed: Feb. 9, 2006

(65) Prior Publication Data

US 2006/0193171 A1    Aug. 31, 2006

(30) Foreign Application Priority Data

Feb. 15, 2005    (KR)    .................. 10-2005-0012300

(51) Int. Cl.
G11C 11/063    (2006.01)
(52) U.S. Cl. .............. 365/194; 365/230.06; 365/189.17
(58) Field of Classification Search ................. 365/194, 365/230.06
See application file for complete search history.

(56) References Cited

U.S. PATENT DOCUMENTS

| | | | | |
|---|---|---|---|---|
| 5,357,479 A | * | 10/1994 | Matsui ................. | 365/230.06 |
| 5,373,471 A | * | 12/1994 | Saeki et al. ................. | 365/200 |
| 6,765,830 B2 | * | 7/2004 | Huang et al. ................. | 365/194 |
| 7,230,862 B2 | * | 6/2007 | Kim et al. ................. | 365/194 |
| 2001/0036111 A1 | | 11/2001 | Hammond | |
| 2002/0006070 A1 | | 1/2002 | Braceras et al. | |
| 2003/0058698 A1 | * | 3/2003 | Mueller et al. ............... | 365/200 |
| 2004/0218444 A1 | * | 11/2004 | Sawhney ................. | 365/202 |
| 2005/0036400 A1 | * | 2/2005 | Chen ................. | 365/233 |

* cited by examiner

Primary Examiner—Vu A Le
Assistant Examiner—Han Yang
(74) Attorney, Agent, or Firm—Harness, Dickey & Pierce, P.L.C.

(57) ABSTRACT

A semiconductor memory device may have a memory cell array with respective memory cells disposed at intersections of rows and columns. The semiconductor memory device may also include at least one decoder and at least one delay controller. The decoder may select a row or column of the memory cell. The signal delay controller may control a delay of an activation signal applied to the row or column by the at least one decoder based on at least one of a position of the at least one memory cell associated with the selected row or column and a line loading capacitance value of the selected memory cell.

16 Claims, 5 Drawing Sheets

SEMICONDUCTOR MEMORY DEVICES HAVING SIGNAL DELAY CONTROLLER AND METHODS PERFORMED THEREIN

This non-provisional patent application claims priority under 35 U.S.C. § 119 to Korean Patent Application 10-2005-0012300 filed on Feb. 15, 2005, the entire contents of which are incorporated herein by reference.

BACKGROUND

1. Field of the Invention

Example embodiments of the present invention relate to semiconductor memory devices having one or more signal delay controllers and methods performed therein.

2. Description of the Conventional Art

As semiconductor memory devices become increasingly integrated they may be decreased in size. As semiconductor memory devices become smaller, the number of net dies per wafer may be reduced.

Semiconductor memory devices may be divided into a plurality of cell array blocks, and may include a row decoder and a column decoder. The row decoder may designate a word line to connect to a unit memory cell, and the column decoder may designate a bit line to connect to a unit memory cell.

FIG. 1 is a block diagram schematically illustrating a conventional semiconductor memory device. As shown, the conventional semiconductor memory device of FIG. 1 may include a memory cell array 10, a peripheral circuit region 16, row decoders 12 and column decoders 14.

The memory cell array 10 may have a plurality of unit memory cells connected to each intersection of bit lines and word lines. When an address is input through an address pin, the bit line and word line may be selected by the row decoder 12 and the column decoder 14, respectively, for decoding the address. The peripheral circuit region 16 may include circuits needed for operation.

In the semiconductor memory device of FIG. 1, path distances between the row decoder 12 and word lines or the column decoder 14 and bit lines within the memory cell array 10 may be similar or substantially similar. In other words, the differences in path distances may be similar or substantially similar. In the memory cell array 10, delay of a signal output from the row decoder 12 to a word line, from a column decoder 14 and to a bit line within the memory cell array 10 and signal skew caused by a voltage variation may not be a problem.

However, as capacity of semiconductor memory devices increases, delay of a signal output from a row decoder to a word line or from column decoder to a bit line within a memory cell array may increase and/or cause a voltage variation resulting in a signal skew.

FIG. 2 is a block diagram illustrating an output path of data in a conventional semiconductor memory device. FIG. 2 shows a row address buffer 20, a row decoder 22, a memory core 26, a data output buffer 28, a column address buffer 21 and a column decoder 23.

The row address buffer 20 may change an external address EXT_ADDX to an internal address INT_ADDX. The row address buffer 20 may operate in response to a row address strobe /RAS.

The row decoder 22 may receive the internal address INT_ADDX and may select a word line connected to an access memory cell. The row decoder 22 may be divided into and/or include a predecoder and a main decoder. However, for the sake of brevity a detailed discussion has been omitted.

The column address buffer 21 may receive an external address EXT_ADDY and may output an internal address INT_ADDY. The column decoder 23 may receive the internal address INT_ADDY and may output data of a bit line. The data may be amplified by a sense amplifier within the memory core 26, and may be output through a data output buffer 28. The memory core 26 may include a plurality of unit memory cells arranged in an array (referred to hereinafter as a cell array or memory cell array), a word line and bit line connected to the unit memory cell and a sense amplifier connected to the bit line.

FIG. 3 is a block diagram schematically illustrating a structure of another conventional semiconductor memory device. As shown, the conventional semiconductor memory device of FIG. 3 may include a memory cell array 30, a peripheral circuit region 36, a row decoder 32 and a column decoder 34. The cell array 30 may be divided into regions or blocks A, B, C and D.

In operation, access times for row decoder 32 to access memory cells in regions A and D may be longer than access times for row decoder 32 to access memory cells of regions B and C. For example, row address access time (tRAC) for memory cells in regions A and D may be longer than tRAC of memory cells in regions B and C. The tRAC represents a time interval from input of an effective row address (e.g., a transition time point of /RAS) to output of effective data (e.g., in response to a row address strobe /RAS).

Similarly, column address access time (tCAC) for column decoder 34 to access memory cells in regions A and B may be longer than column address access time tCAC for column decoder 34 to access memory cells in regions C and D. The tCAC represents a time interval from input of an effective column address point (e.g., a transition time point of /CAS) to output of effective data (e.g., in response to a column address strobe /CAS). The column address strobe /CAS may transition after the row address strobe /RAS.

When a decoding signal, decoded by the row decoder 32 or column decoder 34, is input to the memory cell array 30, path lengths for accessing unit memory cells within the memory cell array 30 may differ for one or more of the regions A, B, C and D. For example, access to a cell further from the row decoder 32 or column decoder 34 may have a larger line loading capacitance relative to a closer cell. Additionally, in accessing cells further from the row decoder 32 or column decoder 34 signal skew generation due to a voltage level change of decoding signal output from the row decoder 32 or column decoder 34 may be more likely.

For example, for the row decoder 32, a boosted voltage level VPP of memory cells in regions A and D within the memory cell array 30 may be changed and there may be an increased possibility of signal skew generation, as compared with memory cells in regions B and C. For column decoder 34, in memory cells in regions A and B within the memory cell array 30, a level of voltage output by an internal voltage converter (IVC) may vary. This may increase a signal skew generation rate.

In one example, to reduce delay and/or the likelihood of signal skew, a memory cell array may be divided into smaller units or a line through which a signal for accessing the memory cell array may be used. However, the above may result in increased chip size due to additional row decoders, column decoders and/or only a single line corresponding to a determined portion of the memory cell array.

In another example, to reduce delay and/or the likelihood of signal skew, a line including a delay device in a memory cell array adjacent to a row decoder or column decoder may be added. The line may be formed of material having a higher resistance or a path of a signal may be lengthened. However, conventional semiconductor memory devices employing these above examples may have a structure in which a line is wired on a region not adjacent to a row decoder or column decoder. This may increase bus problems, restrict process and/or chip size due to a lengthened wiring line.

In conventional semiconductor memory devices, as described above, access times from a row decoder or column decoder may differ based on which portion of the memory cell array is to be accessed. These different access times may cause signal delay when accessing the memory cell array and/or skew of signal accessing the memory cell array may occur. Different access times and/or signal skew may cause operational errors.

SUMMARY OF THE INVENTION

Example embodiments of the present invention provide semiconductor memory devices, which may be capable equalizing or substantially equalizing access times to cell array blocks regardless of their distance from row and/or column decoders. At least some example embodiments of the present invention may reduce or substantially reduce a skew of signal to access to a memory cell array, operational errors, the number of lines added to a memory cell array, delay and/or skew of access signals to memory cells.

In a semiconductor memory device according to at least one example embodiment of the present invention, a memory cell array may have memory cells disposed at respective intersections of rows and columns. The semiconductor memory device may comprise at least one decoder and at least one signal delay controller. The at least one decoder may select a row or column associated with the memory cell. The signal delay controller may control a delay of activation signal applied to the row or column based on a position of memory cell selected by the decoder within the memory cell array.

The at least one signal delay controller may equalize or substantially equalize access times regardless of a memory cells position in the memory cell array.

The signal delay controller may control a delay of the activation signal in response to a block control signal and/or according to a position of memory cell selected by the decoder within the memory cell array. The activation signal may be a decoding signal output from the decoder.

In at least some example embodiments of the present invention, the decoder may be a row or a column decoder for selecting a row or a column of the memory cell, the block control signals may be different according to a location of the memory cell to be accessed. For example, a block control signal for a decoding signal applied to a row associated with a memory cell in a first cell array block may be different from a block control signal for decoding signal applied to a row associated with a memory cell in a second cell array block. In this example, the path lengths for accessing the memory cell from the row decoder may differ (e.g., a path to the first cell array block may differ from a path to the second cell array block). For example, the path length to the first cell array block may be greater than the path length to the second cell array block.

In another example, a block control signal for a decoding signal applied to a column associated with a memory cell in a third cell array block may be different from a block control signal for decoding signal applied to a column associated with a memory cell in a fourth cell array block. In this example, the path lengths for accessing the memory cell from the row decoder may differ (e.g., a path to the third cell array block may differ from a path to the fourth cell array block).

For example, the path length to the third cell array block may be greater than the path length to the fourth cell array block.

In at least some example embodiments of the present invention, a signal delay controller may control a delay of an activation signal applied to a row or column associated with a memory cell. The activation signal may be applied by at least one decoder, and the delay may be controlled based on at least one of a position of the at least one memory cell associated with the row or column and a line loading capacitance value of the memory cell.

In at least some example embodiments of the present invention, the signal delay controller may be configured to input the activation signal to the memory cell array through a first path without delay, for example, when the activation signal is a signal for accessing a memory cell of a first cell array block whose path length from the decoder is longer than that of a second cell array block. The signal delay controller may be configured to input the activation signal to the memory cell array through a second path with delay, for example, when the activation signal is a signal for accessing a memory cell of the second cell array block.

In at least some example embodiments of the present invention, the signal delay controller may include at least one block control unit for controlling a path for applying the activation signal to a selected memory cell based on a received block control signal. The selected memory cell may be included within at least one memory cell block of the memory cell array. The activation signal may be applied to the selected memory cell via a first path without delay or to the selected memory cell via a second path with delay.

Another example embodiment of the present invention provides a semiconductor memory device having a memory cell array including respective memory cells disposed at intersections of rows and columns in a matrix. The semiconductor memory device may include a row decoder, a column decoder and/or a signal delay controller. The row decoder may select a row of the memory cell. The column decoder may select a column of the memory cell. The signal delay controller, through which access times per cell may be equalized or substantially equalized regardless of a position of the memory cells within the memory cell array, may control a delay of activation signal applied or to be applied to the row and column according to a line loading capacitance value of a memory cell selected by the decoders.

Another example embodiment of the present invention provides a semiconductor memory device having a memory cell array including respective memory cells disposed at intersections of rows and columns in a matrix. The semiconductor memory device may include a decoder and/or a signal delay controller. The decoder may output a decoding signal to access to the memory cell. The signal delay controller may be disposed between the decoder and the memory cell array, and operates so that the decoding signal may be input to the memory cell array without delay, for example, when the decoding signal is a signal to access to a memory cell of a first cell array block, and operates so that the decoding signal is input to the memory cell array with delay when the decoding signal is a signal to access to a memory cell of the second cell array block. The path length from the decoder to the first cell array block may be greater than the path length from the decoder to the second cell array block. The decoder may be a row decoder for outputting a row decoding signal to select a word line or a column decoder for outputting a column decoding signal to select a bit line.

In another example embodiment of the present invention, access times may be equalized or substantially equalized within a memory cell array regardless of a position of the memory cells. A decoding signal may be applied to a selected memory cell array through a first path without delay when the decoding signal is a signal for accessing a memory cell of a first cell array block whose path length from the decoder is longer than that of a second cell array block. The decoding signal may be applied to the memory cell array through a second path with delay when the decoding signal is a signal for accessing a memory cell of the second cell array block.

BRIEF DESCRIPTION OF THE DRAWINGS

The present invention will be described with regard to the example embodiments illustrated in the accompanying drawings in which like reference characters refer to the same parts throughout the different views. In the drawings.

DETAILED DESCRIPTION OF EXAMPLE EMBODIMENTS OF THE PRESENT INVENTION

Figure 1:
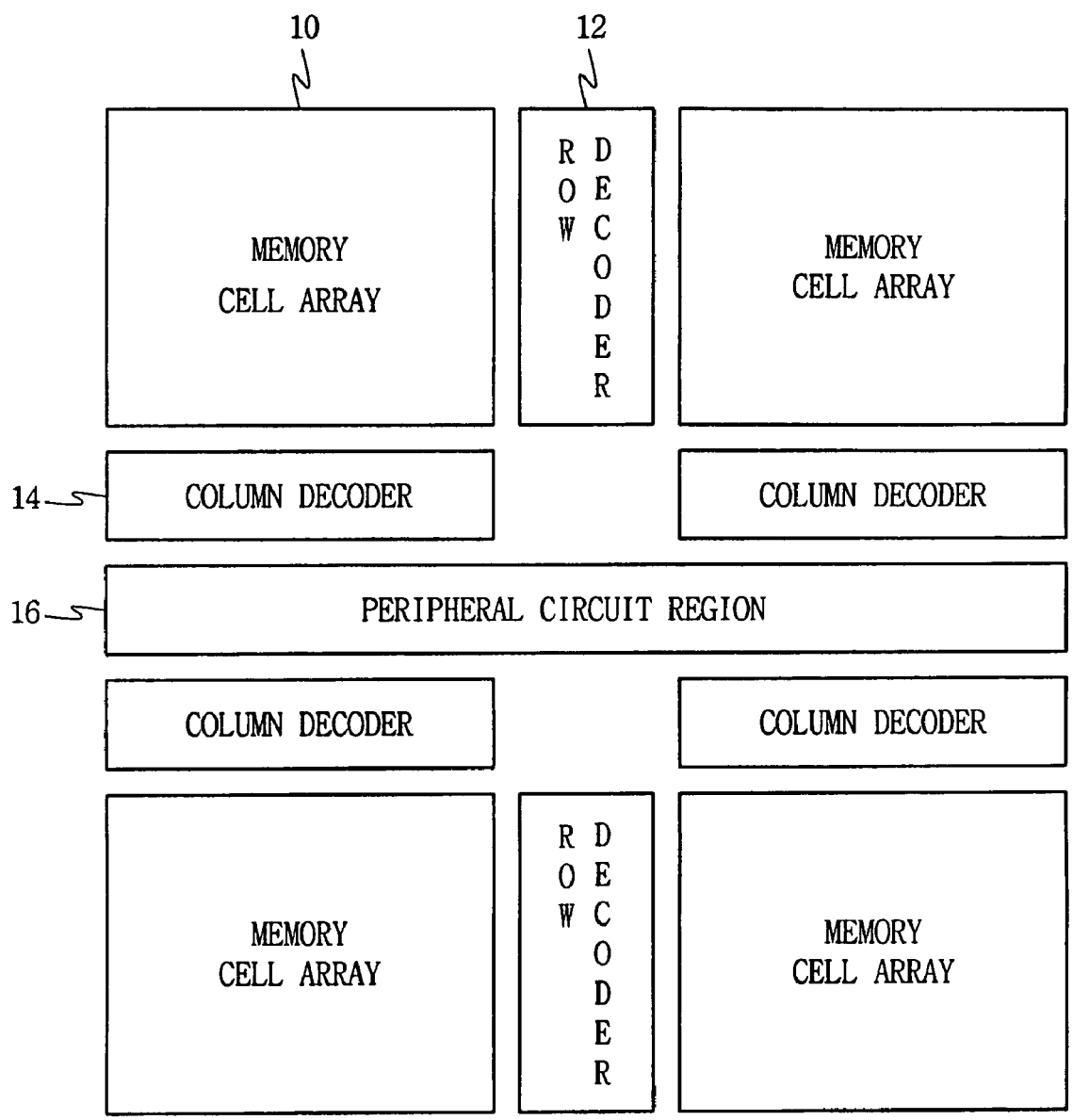
FIG. 1 is a block diagram schematically illustrating a structure of a conventional semiconductor memory device.
Figure 2:
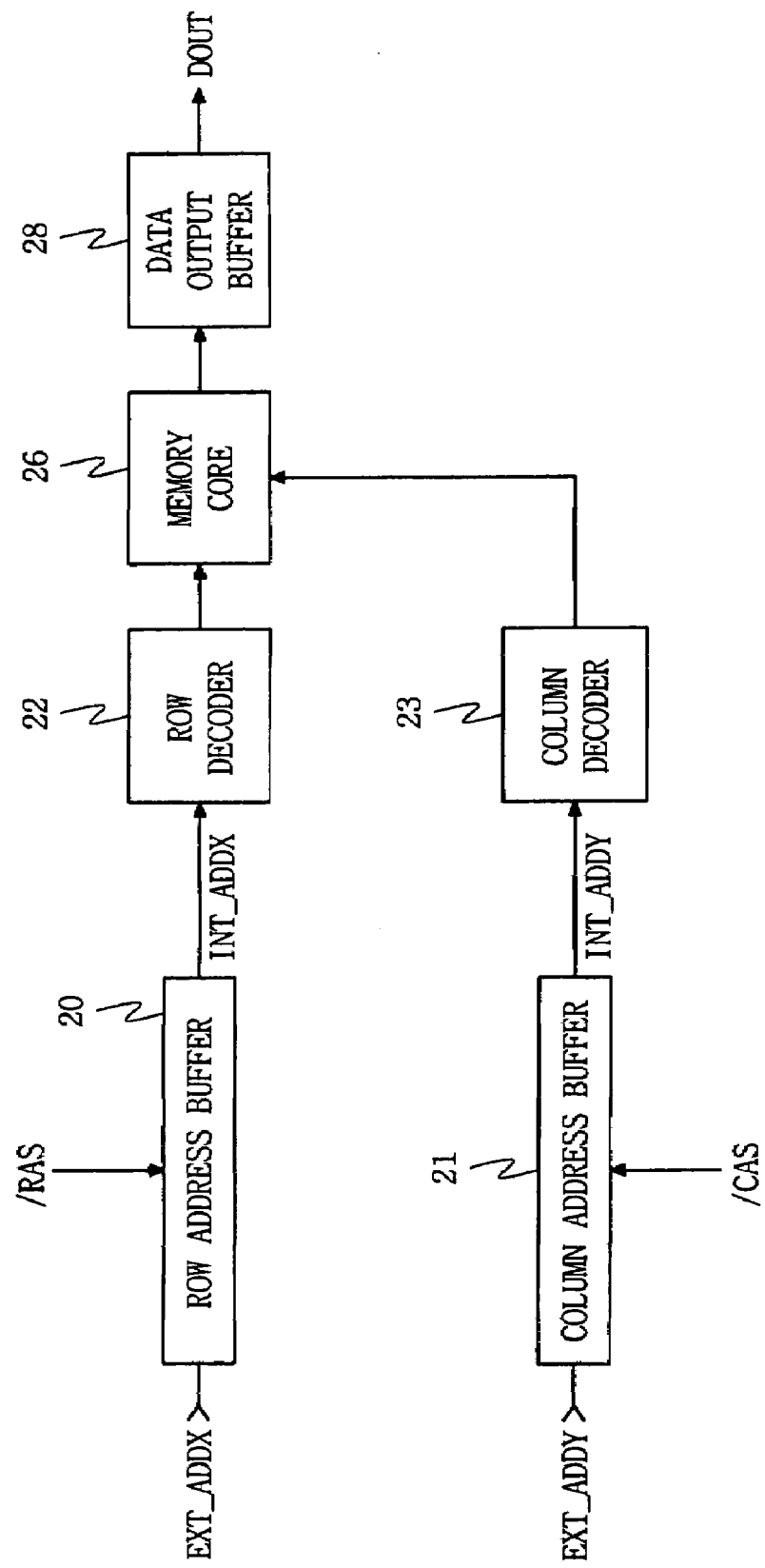
FIG. 2 is a block diagram illustrating an output path for data in a conventional semiconductor memory device.
Figure 3:
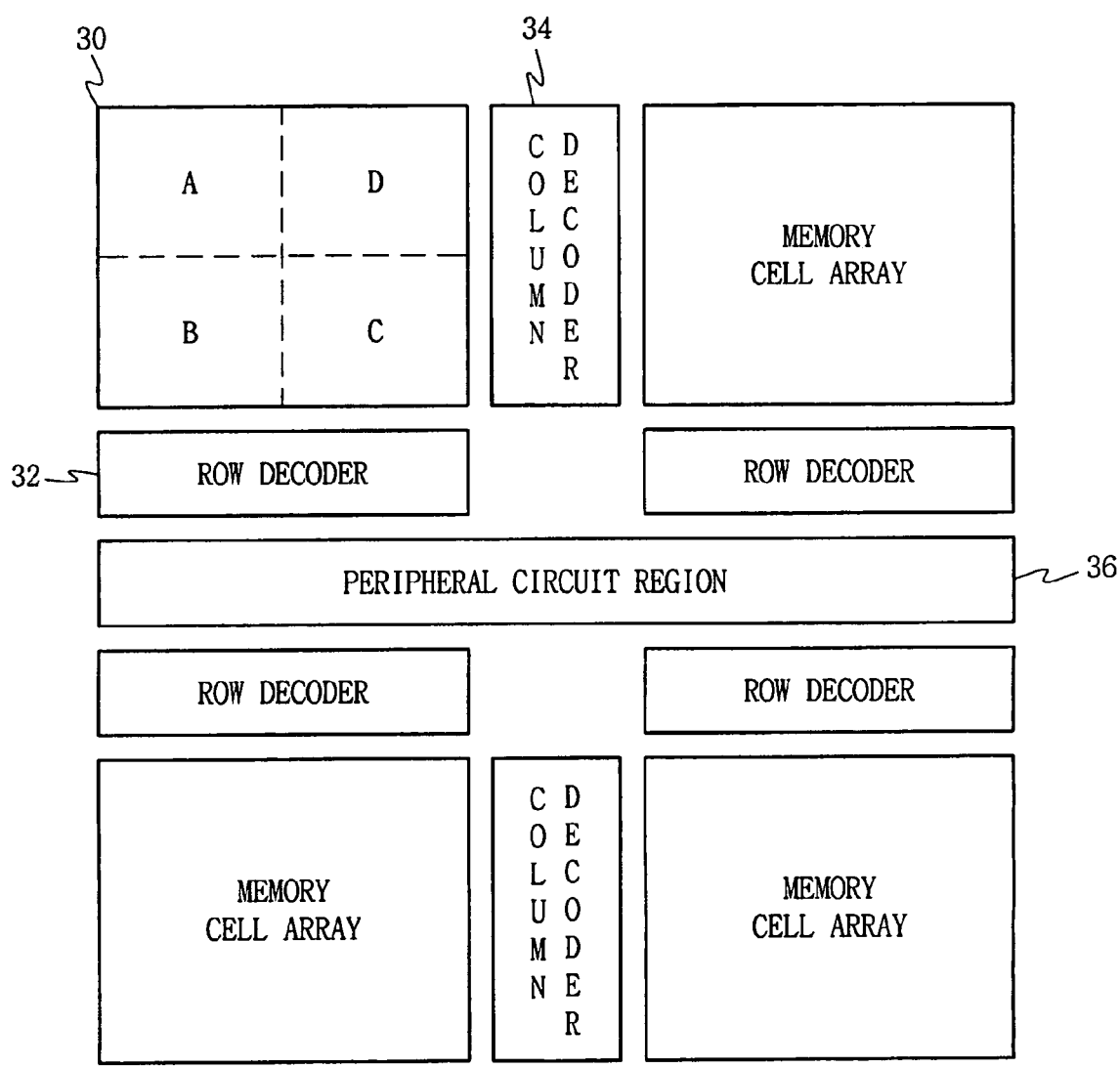
FIG. 3 is a block diagram schematically illustrating a structure of another conventional semiconductor memory device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

A semiconductor memory device, according to example embodiment of the present invention, may include at least one memory cell array, at least one row decoder, at least one column decoder, at least one row signal delay controller and/or at least one column signal delay controller. The at least one memory cell array may include any number of unit memory cells divided into any number of cell array regions or blocks, and any number of bit lines and/or word lines.

Figure 4:
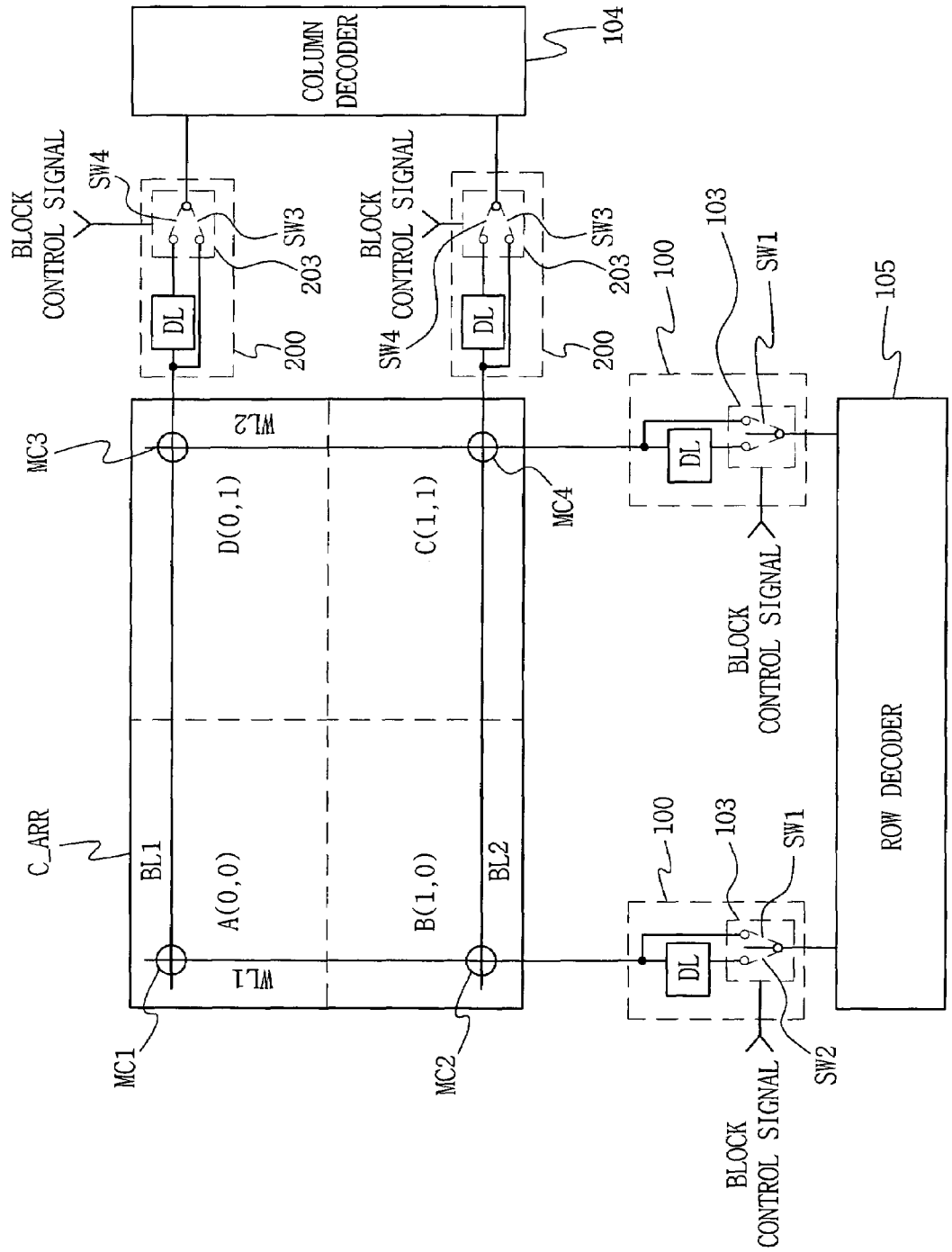
FIG. 4 is a schematic diagram illustrating a portion of semiconductor memory device according to an example embodiment of the present invention.

FIG. 4 is a schematic diagram illustrating a portion of a semiconductor memory device according to an example embodiment of the present invention. As shown, a memory cell array C_ARR may include a plurality of unit memory cells MC1~MC4. The plurality of unit memory sells MC1~MC4 may be disposed or arranged in a matrix and/or may be connected to matrix type intersections of word lines WL1, WL2 and bit lines BL1, BL2.

A row decoder 105 may select a row of respective unit memory cells MC1~MC4 within the memory cell array C_ARR. A column decoder 104 may select a column of respective unit memory cells MC1~MC4 within the memory cell array C_ARR. A row signal delay controller 100 may control a delay of an activation signal applied to a row according to a position of a unit memory cell, within the memory cell array C_ARR, selected by the row decoder 105. A column signal delay controller 200 may control a delay of an activation signal applied to a column according to a position of the unit memory cell, within the memory cell array C_ARR, selected by the column decoder 104. In at least one example embodiment of the present invention, access times may be equalized or substantially equalized regardless of the position of the unit memory cells within the memory cell array.

The row signal delay controller 100 may be controlled by a block control signal. In example operation, the row signal delay controller 100 may control a delay of the activation signal according to a position of memory cell selected by the row decoder 105. The activation signal may be a decoding signal output from the row decoder 105.

The memory cell array C_ARR may be divided into a first cell array block A, D and a second cell array block B, C. In accessing a unit memory cell via the row decoder 105, the path from the row decoder 105 to the first cell array block A, D may be longer than the path to the second cell array block B, C. The block control signals may be different based on the cell array block to be accessed. For example, the block control signals may be different based on the unit memory cell to which the decoding signal is to be applied. For example, a block control signal for controlling a path of a decoding signal to be applied to a row of unit memory cell within the first cell array block A, D may be different from a block control signal for controlling a path of a decoding signal to be applied to a row of unit memory cell within the second cell array block B, C.

The row signal delay controller 100 may include a block control unit 103 operating so that the decoding signal accesses the unit memory cell through either of a first and a second path. The decoding signal may be a row decoding signal.

For example, the block control unit 103 may switch to switch position SW1 in response to the received block control signal. At switch position SW1, the row decoder 105 may be connected to the first path for accessing a unit memory cell of the first cell array block A, D. The block control unit 103 may be switched to switch position SW2 and the row decoder 105 may be connected to the second path for accessing a unit memory cell of the second cell array block B, C. The second path may have a delay part DL for a delaying the decoding signal, whereas the first path may not. In at least some example embodiments of the present invention, a row decoding signal to be applied to a row of a unit memory cell in the first cell array block A, D may be applied via the first path (e.g., without delay), and a row decoding signal to be applied to a row of a unit memory cell in the second cell array block B, C may be applied via the second path (e.g., with delay).

The memory cell array C_ARR may be divided into a third cell array block A, B and a fourth cell array block C, D. In accessing the unit memory cell via the column decoder 104, the path for accessing the third cell array block A, B may be longer than the path for accessing the fourth cell array block C, D. For example, the block control signals may be different based on the unit memory cell to which the decoding signal is to be applied. For example, a block control signal for controlling a path of a decoding signal to be applied to a column of a unit memory cell within the third cell array block A, B may be different from a block control signal for controlling a path of a decoding signal to be applied to a column of unit memory cell within the fourth cell array block C, D.

The column signal delay controller 200 may include a block control unit 203 operating so that the decoding signal accesses to the unit memory cell through either of the third and the fourth path. The decoding signal may be a column decoding signal.

The block control unit 203 may receive the block control signal and may switch to switch position SW3. At switch position SW3, the column decoder 200 may connect to the third path for accessing a unit memory cell in the third cell array block A, B. The block control unit 203 may be switched to switch position SW4 and may connect to the fourth path for accessing a unit memory cell in the fourth cell array block C, D. The fourth path may have a delay part DL for delaying the signal, whereas the third path may not.

In at least some example embodiments of the present invention, a column decoding signal to be applied to a column of a unit memory cell in the third cell array block A, B may be applied via the third path (e.g., without delay), and a column decoding signal to be applied to a column of a unit memory cell in the fourth cell array block C, D may be applied via the fourth path (e.g., with delay).

In at least some example embodiment of the present invention, the signal delay controllers 100 and 200 may control a delay, for example, by dividing the memory cell array C_ARR into two, four, eight or any number of cell array blocks according to the number of paths from the decoders 104 and 105. Example embodiments of the present invention have been described, however, with respect to an example in which the memory cell array is divided into two cell array blocks.

According to at least one example embodiment of the present invention, a semiconductor memory device having a matrix type memory cell array with unit memory cells disposed at intersections of rows and columns may include at least one row decoder 105 for selecting a row of the unit memory cell, at least one column decoder 104 for selecting a column of the unit memory cell and/or at least one signal delay controller 100, 200 for equalizing or substantially equalizing access times per cell.

The signal delay controllers 100 may control a delay of an activation signal applied to word lines WL1, WL2 in accordance with a line loading capacitance value in accessing to a memory cell selected by the decoder 104. The signal delay controllers 200 may control a delay of an activation signal applied to bit lines BL1, BL2 in accordance with a line loading capacitance value in accessing to a memory cell selected by the decoder 105. This may result in equalization or substantial equalization of access times per cell regardless of a position of the unit memory cell within the cell array. The activation signal may be a decoding signal output from a decoder 104 and/or 105. The signal delay controllers 100 may be positioned between the row decoder 105 and the memory cell array C_ARR, and the signal delay controllers 200 may be positioned between the column decoder 104 and the memory cell array C_ARR.

As described above, according to at least one example embodiment of the present invention, a semiconductor memory device having a matrix type memory cell array with respective unit memory cells disposed at intersections of rows and columns, may include at least one decoder for outputting a decoding signal to access to the unit memory cell, and/or at least one signal delay controller disposed between the decoder and the memory cell array.

The decoder may be, for example, a row decoder 105 for accessing a word line connected to the unit memory cell or a column decoder 104 for accessing a bit line connected to the unit memory cell.

The signal delay controller 100 may operate so that the decoding signal may not be input to the memory cell array through a delay part DL, when the decoding signal is a signal for accessing a unit memory cell of a first cell array block A, D. Alternatively, the signal delay controller 100 may operate so that the decoding signal may be input to the memory cell array through the delay part DL when the decoding signal is a signal for accessing a unit memory cell of the second cell array block B, C. An access time for accessing the unit memory cell of the first cell array block A, D may be equal or substantially equal to an access time for accessing the unit memory cell of the second cell array block B, C. The memory cell array may be divided into at least first and second cell array blocks.

Figure 5:
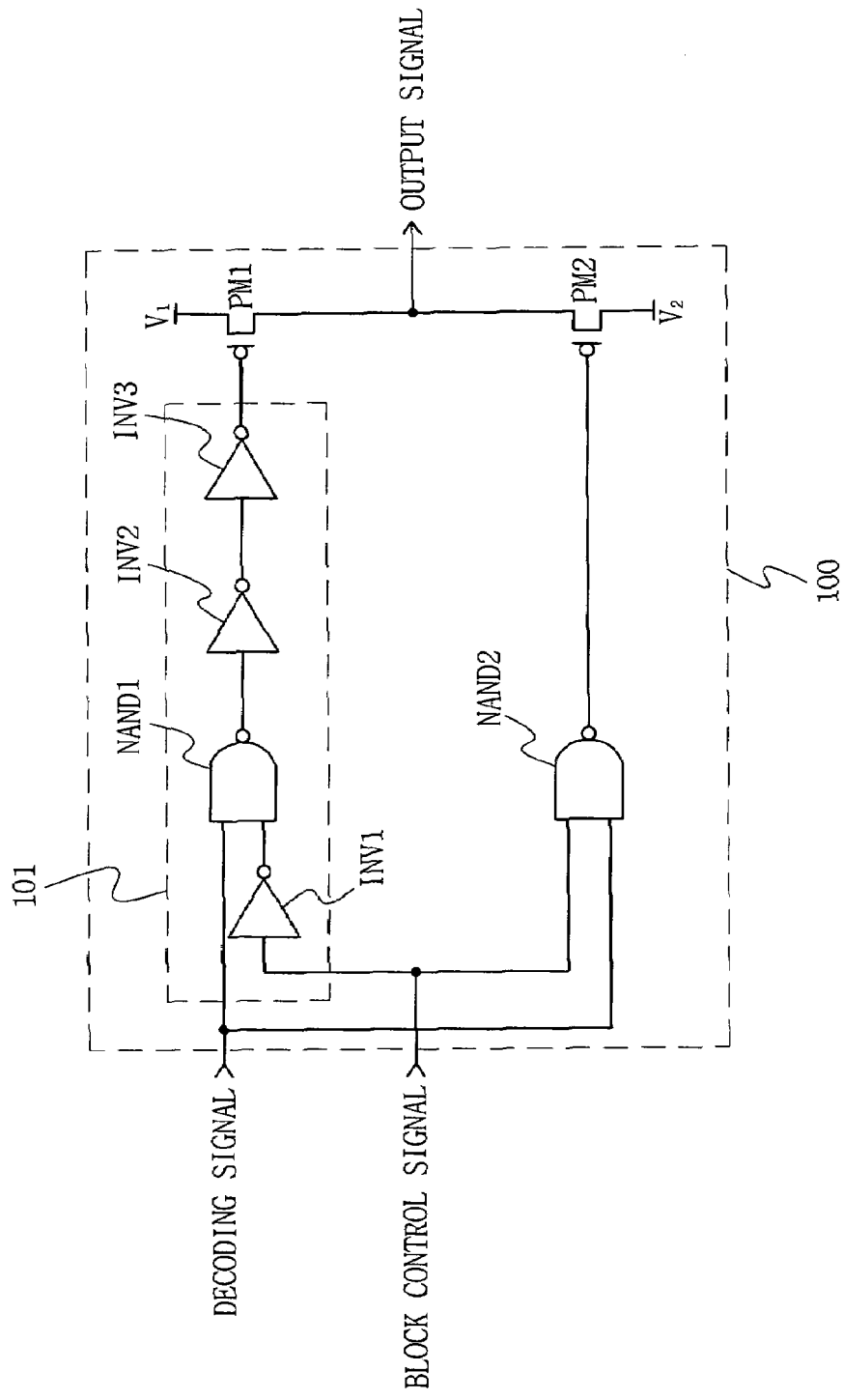
FIG. 5 is a circuit diagram illustrating an example of signal delay controller according to an example embodiment of the present invention.

FIG. 5 is a circuit diagram illustrating a signal delay controller according to an example embodiment of the present invention. Referring to FIGS. 4 and 5, a signal delay controller 100 may receive a decoding signal output from the row decoder 105, a block control signal for selecting one of two paths (e.g., a delay path and a non-delay path), and output signal a signal for accessing a memory cell. Though only the signal delay controller 100 shown in FIG. 5 will be described in the following, signal delay controller 200 positioned between the column decoder 104 and a bit line may be the same or substantially the same.

The decoding signal may be a signal for activating a word line connected to a unit memory cell of a memory cell array C_ARR.

The block control signal may be a signal for controlling a delay of an activation signal applied to the word line, in accordance with a path length from row decoder 105 to a memory cell of the memory cell array C_ARR and/or a line loading capacitance value.

For example, when a path length to a unit memory cell of the memory cell array is longer and/or a line loading capacitance value is larger, a decoding signal having a logic value 1 may be input. When a block control signal has a logic value 1, the block control signal may be inverted by an inverter INV1 and signals input to logic gate (e.g., a NAND gate) NAND1 may have logic values 1 and 0. The logic gate NAND1 may output a logic 1, which may be delayed by inverters INV2 and INV3 and a transistor (e.g., a P-type Metal Oxide Semiconductor (MOS) transistor) PM2 may be turned off. A signal input to a logic gate (e.g., a NAND gate) NAND2 may have logic values 1 and 1 and an output signal there from may have a logic value 0. A transistor (e.g., a P-type MOS transistor) PM2 may be turned on and a voltage of $V_2$ may be applied to an output terminal. This may generate an output signal.

In another example operation, when the block control signal has a logic value 0, the transistor (e.g., a P-type MOS transistor) PM1 may be turned on by a signal passed through a delay path 101. A voltage $V_1$ may be applied to an output terminal and an output signal may be generated. The block control signal may have a logic value of 0 or 1. To output an output signal for accessing a unit memory cell of the memory cell array from the decoding signal passed through a delay part, the block control signal having a logic value 0, and a block control signal having a logic value 1 may be input. The $V_1$ and $V_2$ may be a boosted voltage VPP and may be converted by an internal voltage converter (IVC).

When the decoding signal is a signal activating a word line connected to a unit memory cell of the memory cell array, an external column address or internal column address may be used as the block control signal. The external column address may be a signal before a column decoding signal is buffered by a column address buffer. The internal column address may be a signal after the buffering.

When the decoding signal is a signal activating a bit line, an external row address or internal row address may be used as the block control signal. The external row address may be a signal before a row decoding signal is buffered by a row address buffer. The internal row address may be a signal after the buffering.

As described above, a semiconductor memory device according to one or more example embodiments of the present invention may reduce, suppress and/or prevent delay problems in which a signal for accessing a memory cell array. Delay problems may be caused by, for example, different access times associated with respective memory cells at different distances from the row and/or column decoders. In addition, or alternatively, one or more example embodiments of the present invention, may reduce, substantially reduce and/or prevent skew of signal for accessing a memory cell array, for example, by reducing and/or preventing errors in operation of semiconductor memory devices.

A signal delay controller according to example embodiments of the present invention may reduce, substantially reduce and/or prevent the number of lines specifically added to a memory cell array, which may reduce a delay of access signal to a memory cell or a signal skew.

Example embodiments of the present invention have been described with respect to specific logic signals. However, these logic signals (e.g., logic 1 and 0) may be entirely interchangeable. Additionally, any suitable logic signal may be used, for example, a logic high and logic low, etc. Example embodiments of the present invention have been described with regard to P-type Metal Oxide Semiconductor (MOS) transistors; however, any suitable MOS transistor may be used.

It will be apparent to those skilled in the art that modifications and variations can be made in the present invention without deviating from the spirit or scope of the invention. Thus, it is intended that the present invention cover any such modifications and variations provided they come within the scope of the appended claims and their equivalents. Accordingly, these and other changes and modifications are seen to be within the true spirit and scope of the present invention as defined by the appended claims.

What is claimed is:

1. A semiconductor memory device including at least one memory cell array, the memory cell array having memory cells disposed at intersections of rows and columns, the device comprising:
    at least one decoder configured to select at least one of at least one row and at least one column associated with at least one memory cell; and
    at least one signal delay controller configured to control a delay of an activation signal applied to the at least one of row and column by the at least one decoder in response to a block control signal based on at least one of a position of the at least one memory cell associated with the selected at least of one of row and column and a line loading capacitance value of the selected memory cell,
    wherein the at least one signal delay controller equalizes access times for accessing memory cells regardless of a position of the memory cells within the memory cell array.

2. The device of claim 1, wherein the activation signal is a decoding signal output from the at least one decoder.

3. The device of claim 1, wherein the at least one decoder is a row decoder configured to select a row associated with the memory cell.

4. The device of claim 1, wherein the at least one decoder is a column decoder configured to select a column associated with the memory cell.

5. The device of claim 1, wherein the at least one signal delay controller includes,
    at least one block control unit configured to control a path for applying the activation signal to a selected memory cell based on the received block control signal, the selected memory cell being included within at least one memory cell block of the memory cell array, wherein
    the activation signal is applied to the selected memory cell via one of a first path without delay and a second path with delay.

6. The device of claim 1, wherein the at least one decoder includes a row decoder configured to select a row of the memory cell, and a column decoder configured to select a column of the memory cell.

7. The device of claim 6, wherein the activation signal is a decoding signal output from at least one of the row decoder and the column decoder.

8. The device of claim 1, wherein the at least one signal delay controller is between the at least one decoder and the memory cell array and the memory cell array is divided into at least two cell array blocks, wherein the at least one signal delay controller is configured to input the activation signal to the memory cell array through a first path without delay when the activation signal is a signal for accessing a memory cell within a first cell array block having a path length from the at least one decoder that is longer than a path length for accessing memory cells within a second cell array block, and wherein the at least one signal delay controller is configured to input the activation signal to the memory cell array through a second path with delay when the activation signal is a signal for accessing a memory cell of the second cell array block.

9. The device of claim 1, wherein the at least one signal delay controller is controlled by the block control signal that differs based on which cell array block the block control signal is to be applied.

10. The device of claim 1, wherein the at least one decoder is a row decoder configured to output a row activation signal to select a word line.

11. The device of claim 1, wherein the at least one decoder is a column decoder configured to output a column activation signal to select a bit line.

12. A signal delay controller comprising:

a controller configured to control a delay of an activation signal based on at least one of a position of at least one memory cell within a memory cell array and a line loading capacitance value of the at least one memory cell, with the activation signal being applied by at least one decoder to at least one of a row and column associated with the at least one memory cell, wherein the controller is configured to input the activation signal to the memory cell array through a first path without delay when the activation signal is a signal for accessing a memory cell of a first cell array block having a path length from the decoder that is longer than a path length from the decoder to a second cell array block, and the controller is configured to input the activation signal to the memory cell array through a second path with delay when the activation signal is a signal for accessing a memory cell of the second cell array block.

13. The signal delay controller of claim 12, wherein the controller includes, at least one block control unit configured to control a path for applying the activation signal to a selected memory cell based on a received block control signal, the selected memory cell being included within at least one memory cell block of the memory cell array, and wherein the activation signal is applied to the selected memory cell via one of a first path without delay and a second path with delay.

14. A semiconductor memory device including at least one memory cell array with respective memory cells disposed at intersections of rows and columns, the device comprising:

at least one decoder configured to select at least one of a row and a column for at least one memory cell; and at least one signal delay controller as claimed in claim 12.

15. A semiconductor memory device including at least one memory cell array with respective memory cells disposed at intersections of rows and columns, the device comprising:

at least one decoder configured to select at least one of a row and a column for at least one memory cell; and at least one signal delay controller for equalizing access times for accessing memory cells regardless of a position of the memory cells within the memory cell array in response to a block control signal based on at least one of a position of the at least one memory cell associated with the selected at least of one of row and column and a line loading capacitance value of the selected memory cell, wherein the access times are equalized according to a method including, providing a decoding signal to a selected memory cell array through a first path without delay when the decoding signal is a signal for accessing a memory cell within a first cell array block having a path length from the decoder longer than a path length for accessing memory cells within a second cell array block, and providing the decoding signal to the memory cell array through a second path with delay when the decoding signal is a signal for accessing a memory cell within the second cell array block.

16. A semiconductor memory device including at least one memory cell array, the memory cell array having memory cells disposed at intersections of rows and columns, the device comprising:

at least one decoder configured to select at least one of at least one row and at least one column associated with at least one memory cell; and at least one signal delay controller configured to control a delay of an activation signal applied to the at least one of row and column by the at least one decoder based on at least one of a position of the at least one memory cell associated with the selected at least of one of row and column and a line loading capacitance value of the selected memory cell, wherein the at least one signal delay controller is between the at least one decoder and the memory cell array and the memory cell array is divided into at least two cell array blocks, wherein the at least one signal delay controller is configured to input the activation signal to the memory cell array through a first path without delay when the activation signal is a signal for accessing a memory cell within a first cell array block having a path length from the at least one decoder that is longer than a path length for accessing memory cells within a second cell array block, and wherein the at least one signal delay controller is configured to input the activation signal to the memory cell array through a second path with delay when the activation signal is a signal for accessing a memory cell of the second cell array block.

* * * * *